US006878572B2

(12) United States Patent
Nair

(10) Patent No.: US 6,878,572 B2
(45) Date of Patent: Apr. 12, 2005

(54) HIGH CAPACITANCE PACKAGE SUBSTRATE

(75) Inventor: Rajendran Nair, Gilbert, AZ (US)

(73) Assignee: Intel Corporation, Santa Clara, CA (US)

(*) Notice: Subject to any disclaimer, the term of this patent is extended or adjusted under 35 U.S.C. 154(b) by 52 days.

(21) Appl. No.: 10/158,987

(22) Filed: May 30, 2002

(65) Prior Publication Data

US 2003/0222314 A1 Dec. 4, 2003

(51) Int. Cl.[7] .................................... H01L 21/48

(52) U.S. Cl. .................................... 438/121

(58) Field of Search .................. 438/90, 106, 121, 438/396, 660, 661, 667; 257/700, E21.324; 432/13

(56) References Cited

U.S. PATENT DOCUMENTS 4,328,614 A * 5/1982 Schelhorn .................... 29/842
4,733,328 A * 3/1988 Blazej ........................ 361/320
4,997,698 A * 3/1991 Oboodi et al. .............. 428/209
5,576,577 A * 11/1996 Takenouchi et al. ........ 257/672
5,644,327 A * 7/1997 Onyskevych et al. ......... 345/80
5,709,928 A * 1/1998 Ikeda et al. ................. 428/212
2002/0080556 A1 * 6/2002 Japp et al. ............... 361/306.3

OTHER PUBLICATIONS

Young, K.F. and Frederikse, H.P.R, J. Phys. Chem. Ref. Data, 2, 313, (1973), sect. 12, pp 48.*

* cited by examiner

*Primary Examiner*—Carl Whitehead, Jr.
*Assistant Examiner*—Jennifer M Dolan
(74) *Attorney, Agent, or Firm*—Kathy J. Ortiz

(57) ABSTRACT

A high capacitance substrate. The substrate includes a core tolerant to sintering thereon of a high k material to provide increased capacitance. The core may be non-ceramic. The material sintered thereon may have a dielectric constant in excess of about 4. The substrate may be a package substrate electrically coupled to a die.

14 Claims, 7 Drawing Sheets

230 218 225 213 211 212 220 210 227 215 214 217

HIGH CAPACITANCE PACKAGE SUBSTRATE

BACKGROUND

The present invention relates to substrates incorporating capacitance. In particular, the present invention relates to displaying a high dielectric constant value and materials in substrates for use with very large scale integration (VLSI) devices.

BACKGROUND OF THE RELATED ART

In the fabrication of microchips or dice such as a very large scale integration (VLSI) device, semiconductor wafers are processed and sliced into individual dice. The dice may then be used in a wide variety of devices. For example, a die may be used in an electronic device by being electronically coupled to an electronic system such as a printed circuit board (PCB) of the device.

Once the die is fabricated, packaging will take place. The packaging process involves the coupling of the die to a protective package substrate which in turn couples directly to the PCB. The package substrate includes conductive bond pads which are coupled to an array of metal bumps or other conductive features of the die. The bond pads are in turn coupled to internal circuitry within the package substrate. In this manner, the larger package substrate acts as an electronic interface to fan out electronic paths between the compact internal circuitry of the die to the much larger PCB.

In the formation of a die and packaging, capacitance (C) is often at issue. Capacitance (C) can be calculated as $$\frac{k \in^{\circ} A}{d}$$

where (d) is the distance between conductive features, such as conductive metal lines of a die, (A) is the interfacing area of adjacent conductive features, (∈) is the permeability of the material between conductive features, and (k) is the relative dielectric constant (a factor of how much effect the noted material has on capacitor value).

A die may require large amounts of power and therefore increased capacitance (C) for decoupling purposes. For example, as a microprocessor die transitions from an idle condition to an operating condition or vice versa, sudden and large amounts of power are intermittently required in the small area of the die. Sudden charge demands in this small area may lead to transient voltage variations within the die. Therefore, to accommodate a large influx or overflow of charge, areas of increased capacitance (C) may be utilized near circuits demanding large, transient amounts of charge. For example, discrete capacitor or metal insulator metal (MIM) devices may be mounted on the die, the nearby package substrate, or even the PCB. Alternatively, the package substrate may be formed from a ceramic core that includes 'high k' materials for added capacitance. MIM devices mounted on the die are very effective due to being located close to the circuitry of the die. Unfortunately, the use of MIM devices lowers yield and increases manufacturing costs.

DETAILED DESCRIPTION

Embodiments of forming a high capacitance semiconductor substrate are described. Aspects of the embodiments are described and illustrated by the accompanying drawings. While the following embodiments are described with reference to the formation of a particular substrate in the form of a package substrate, the embodiments are applicable to any semiconductor substrate. This may include semiconductor substrates for dice and printed circuit boards (PCBs).

Embodiments described below are generally applicable to high capacitance substrates to account for the event of a sudden increase in current directed through the die of the semiconductor package. In this manner, an excess or overflow of charge may be accommodated by a high capacitance substrate. Embodiments of such high capacitance substrates may include inexpensive non-ceramic cores and be of materials tolerant to temperatures for sintering of high-k materials thereto.

Figure 1:
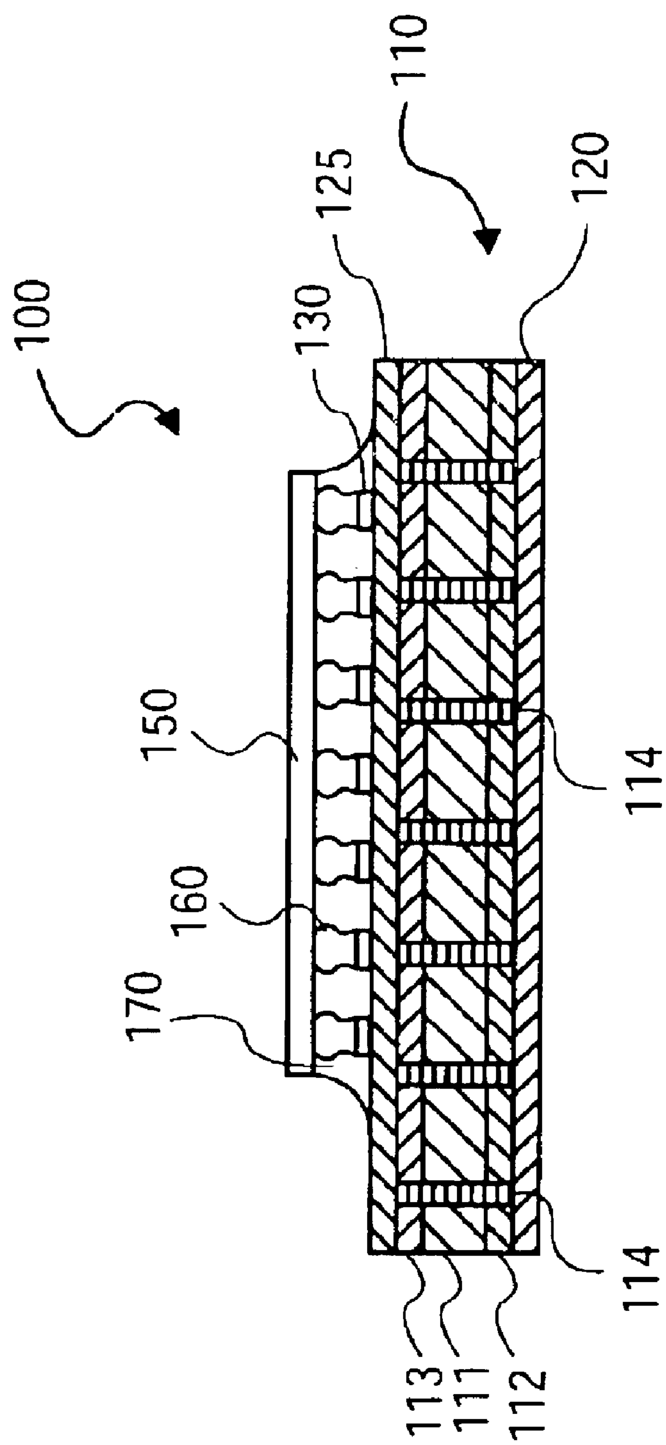
FIG. 1 is a side cross-sectional view of a semiconductor package utilizing an embodiment of a high capacitance package substrate.

Referring now to FIG. 1, a high capacitance substrate is shown in the form of a high capacitance package substrate 110 of a semiconductor package 100. The high capacitance package substrate 110 includes a core 111 which may be an inorganic non-ceramic or metal core with layers of capacitance formed thereon. This may be thought of in terms of affecting an increase in the electrical capacity of the high capacitance package substrate 110. In one embodiment, materials or layers added to the core 111 include a dielectric constant that is greater than about 4 (i.e. 'high k' materials). Additionally, the core 111 is configured to be tolerant to sintering thereto of such materials as described further herein. In the embodiment shown, the layers of formed of high k material include a land side capacitance layer 112 and a die side capacitance layer 113. However, additional layers formed of high k material may be incorporated into the high capacitance package substrate 110. Additionally, the high capacitance package substrate 110 may include circuit layers 120, 125, including metal traces and other circuit features, above and below the core 111. The circuit layers 120, 125 may actually include multi-layered circuitry isolated by inter-layer dielectric (ILD) material.

FIG. 1 also reveals vias 113. The vias run through the core 111 and high capacitance layers 112, 113. Embodiments may include certain vias 114 insulated by low k material to allow for high speed signal transmission. Other vias 114 may act as capacitors. The incorporation of vias 114 to act as capacitors and vias 114 for high speed signal transmission in the same package substrate 110 is detailed in FIGS. 2A–2E with reference to high capacitance vias 214 and high speed vias 217.

Continuing with reference to FIG. 1, the semiconductor package 100 is shown accommodating a die 150 by coupling of bond pads 130 of the high capacitance package substrate 110 to metal bumps 160 of the die 150. The die 150 may include multiple interconnected layers of compact circuitry. Adhering and stabilizing the die 150 to the high capacitance package substrate is a conventional underfill epoxy adhesive 170.

The semiconductor package 100 shown in FIG. 1 may be coupled to an electronic device, for example, by being secured to a PCB of the device. In this manner, the high capacitance package substrate 110 may act as an electronic interface to fan out electronic paths between the compact circuitry of the die 150 to the PCB. Additionally, while compact circuitry of the die 150 may be subjected to sudden and large fluctuations of charge, the nearby high capacitance package substrate 110 is equipped with added capacitance in the form of high k material to accommodate any overflow of such charge or to provide any additional required charge.

With reference to FIGS. 2A–2E, embodiments of forming a high capacitance package substrate 210 are described. The high capacitance package substrate 210 may be formed from a core of metal or other non-ceramic material. Therefore, the core 211 may be referred to as a non-ceramic core 211. By utilizing a core 211 of non-ceramic materials, the expense of ceramic materials may be avoided. Additionally, the materials of the core 211 may be tolerant to processing temperatures for sintering of high capacitance material layers 212, 213 thereto. That is, the core 211 may be exposed to such temperatures, described further herein, without melting or significant deterioration.

The core 211 may be of materials having a coefficient of thermal expansion (CTE) tailored to substantially match a CTE of silicon or a silicon based material. For example, in one embodiment materials that form the core 211 include a CTE of between about 3 and about 5. In this manner, the core 211 expands or contracts during thermal cycles encountered during processing, to substantially the same degree as circuit layers 220, 225 which include silicon based ILD materials. Therefore, circuit layers 220, 225 are not subjected to significant additional stress from the expanding or contracting size of the core 211 during processing.

The embodiments described with reference to FIGS. 2A–2E include the formation of a high capacitance package substrate 210 to provide additional high k material in the vicinity of a die 350 (see FIG. 3). However, alternate embodiments may employ added capacitance directly to a die substrate or to a PCB as described further herein.

Figure 5:
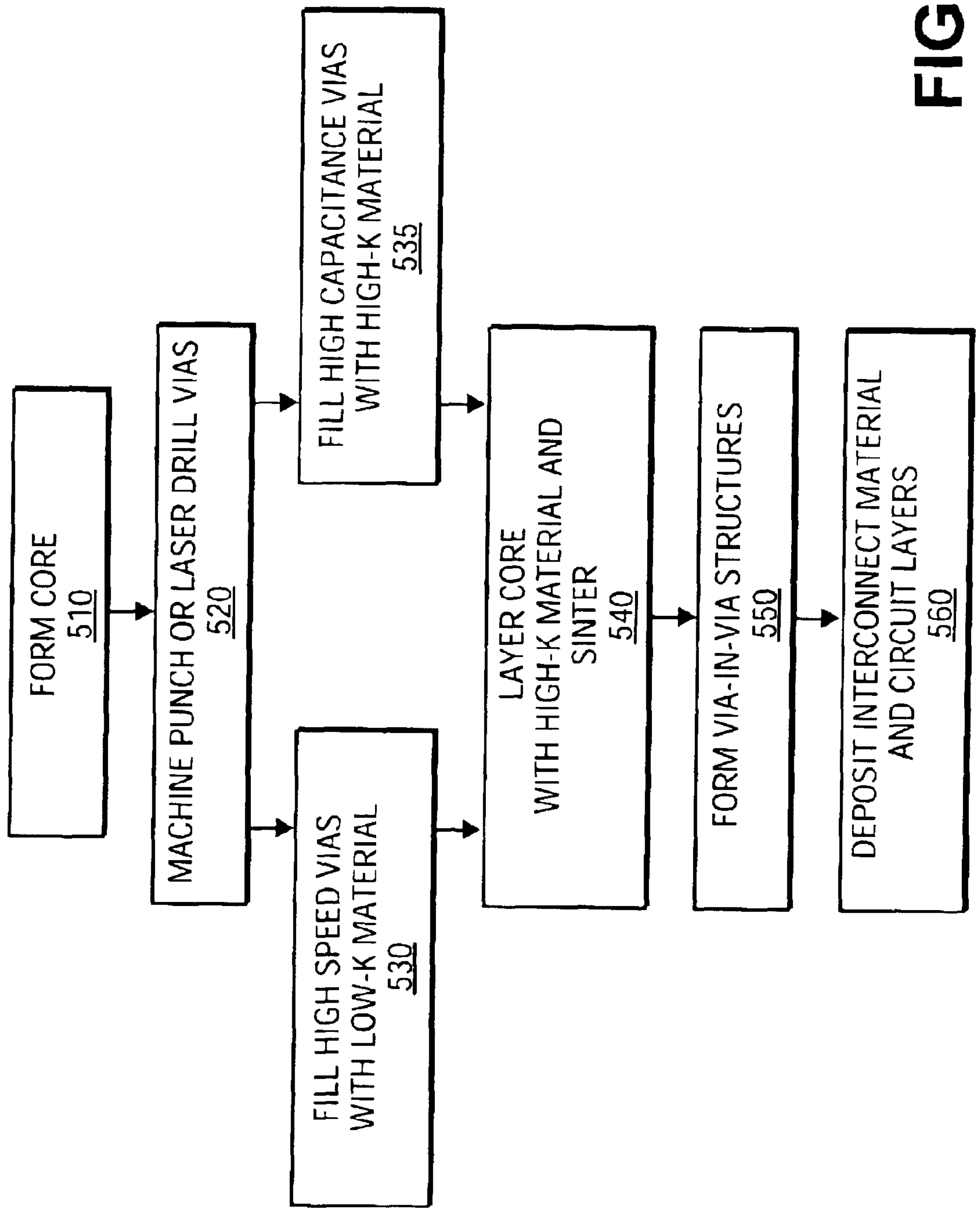
FIG. 5 is a flowchart summarizing embodiments of forming a high capacitance package substrate.

In conjunction with FIGS. 2A–2E, FIG. 5 depicts a flow-chart summarizing embodiments described herein. FIG. 5 is referenced throughout the following description as an aid in describing methods of forming a high capacitance package substrate from a non-ceramic core.

Figure 2A:
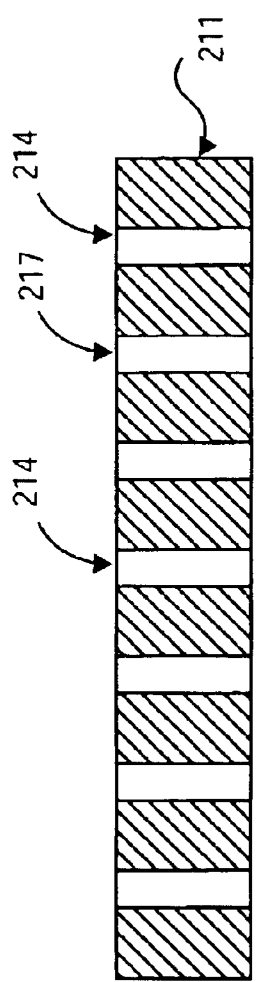
FIG. 2A is a side cross-sectional view of an embodiment of a non-ceramic core to form a high capacitance package substrate.

Referring now to FIG. 2A, a side cross-sectional view of an embodiment of a core 211 is shown. In one embodiment, a nickel iron alloy is used to form the core 211. The alloy may be of about 42% nickel and about 58% iron, which may be referred to as 'nickel 42' or 'alloy 42'. In this embodiment, the core 211 may be capable of withstanding processing temperatures of up to about 1,427° C. without melting or significantly deteriorating. In another embodiment copper is used to form the core 211. Alternatively, the core 211 may include copper and a non-copper material. For example, alloy 42 may be metalized with a copper layer of between about 15 microns and about 25 microns to form a core of greatly reduced resistance. In embodiments employing copper, the core 211 remains tolerant to processing temperatures of up to about the melting point of copper (i.e. about 1,083° C.).

The core 211 shown includes vias 214, 217. As shown at block 520 of FIG. 5, the vias 214, 217 may be formed by machine punching, laser drilling or any other conventional means. The vias 214, 217 provide a pathway for the formation of electronic interconnects as described further herein. Additionally, the vias 214, 217 may be designated as high capacitance vias 214 or high speed vias 217, depending upon the type of interconnect to be accommodated, as also further described herein.

Figure 2B:
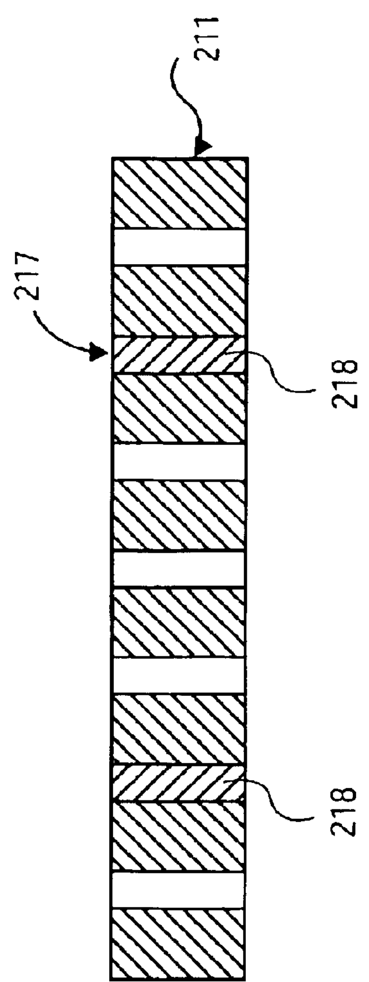
FIG. 2B is a side cross-sectional view of the non-ceramic core of FIG. 2A to accommodate high speed signal vias.

Referring to FIG. 2B a side cross-sectional view of the core 211 of FIG. 2A is shown. As shown in FIG. 2B and at block 530 of FIG. 5, the high speed vias 217 are filled with a dielectric material having a relative dielectric constant of less than about 4. For example, as described further herein, aluminum may be selectively delivered to the high speed vias 217 and oxidized to form aluminum oxide 218 displaying a dielectric constant less than about 4 (i.e. a 'low k').

In one embodiment, aluminum is selectively sputtered by conventional means to fill the high speed vias 217. For example, the sputtering may proceed with the core 211 entirely masked by nickel, or as described further herein, at the location of the high speed vias 217. The core 211 is then placed in an oxidation chamber where it is heated in the presence of an oxygen rich atmosphere until a desired dielectric constant value of aluminum oxide 218 is achieved. In an embodiment where the core 211 is copper, or includes a layer of copper at the outer surfaces, the core 211 may be covered with a protective covering of nickel or other suitable material prior to placement in the oxidation chamber. In this manner, undesired oxidation of the copper may be avoided.

Figure 2C:
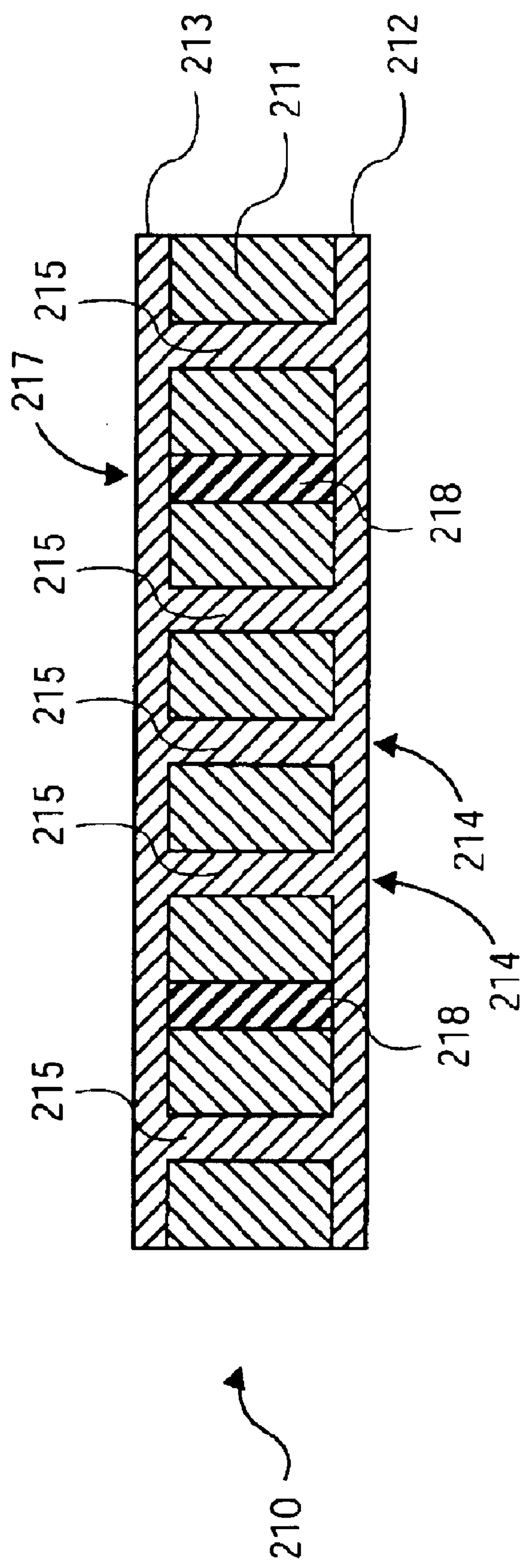
FIG. 2C is a side cross-sectional view of a high capacitance package substrate formed from the non-ceramic core of FIG. 2B and having high capacitance layers.

Referring to FIG. 2C, high k material is added to the core 211 in the form of high capacitance material layers 212, 213. Thus, a high capacitance package substrate 210 is formed. The high capacitance material layers 212, 213 may be added to both sides of the core 211, designated here as land side 212 and die side 213 high capacitance material layers. This may be achieved in a single processing step. In the embodiment shown, additional capacitance is added to the core 211 by filling the high capacitance vias 214 with the material forming the high capacitance material layers 212, 213. Such high capacitance material 215 is shown within the high capacitance vias 214 of FIG. 2C. As shown at blocks 535 and 540 of FIG. 5, the high capacitance vias 214 may be filled prior to forming high capacitance material layers 212, 213 to ensure that the high capacitance vias 214 are not unintentionally blocked and left void of high capacitance material.

The material forming the high capacitance material layers 212, 213 may have a dielectric constant of greater than about 4 (i.e. a 'high k' material). For example, in one embodiment, the material may be barium titanate displaying a dielectric constant of between about 15 and about 19. The material forming the high capacitance material layers 212, 213 may be delivered to the core 211 by conventional deposition techniques. Chemical vapor deposition (CVD) may be used, including plasma enhanced CVD (i.e. PECVD). The material is sintered to the core 211 during or subsequent to deposition. In another embodiment tantalum pentoxide, displaying a dielectric constant between about 10.6 and about 12.6, is used to form the high capacitance material layers 212, 213 in the manner indicated. Additionally, barium strontium titanate may be used to form the layers 212, 213 as indicated.

As noted above, and at block 540 of FIG. 5, a material such as barium titanate may require sintering to adequately form the material micro-structure to anneal to the core 211. In embodiments where the core 211 is of copper or includes copper surfaces, sintering is achieved by exposing the core 211 to a temperature of up to about 1,083° C. Sintering as described here may be accomplished in a conventional deposition reactor.

As noted above, the core 211 is of a material able to tolerate sintering temperatures without melting or significantly deteriorating. For example, in an embodiment where the core 211 includes copper, sintering may proceed at temperatures of up to about 1,083° C. as described above, with the core 211 remaining stably intact. Additionally, embodiments may include sintering temperatures in excess of 1,083° C. (i.e. up to about 1,427° C.) where the core 211 is of alloy 42 and lacks copper at its surfaces.

While a high k material such as barium titanate is ceramic in nature, material expenses are nevertheless reduced in that ceramic materials are not required in forming the entire core 211. Rather, a smaller amount of such a ceramic material may be used in the formation of the high capacitance package substrate 210 as indicated above.

Figure 2D:
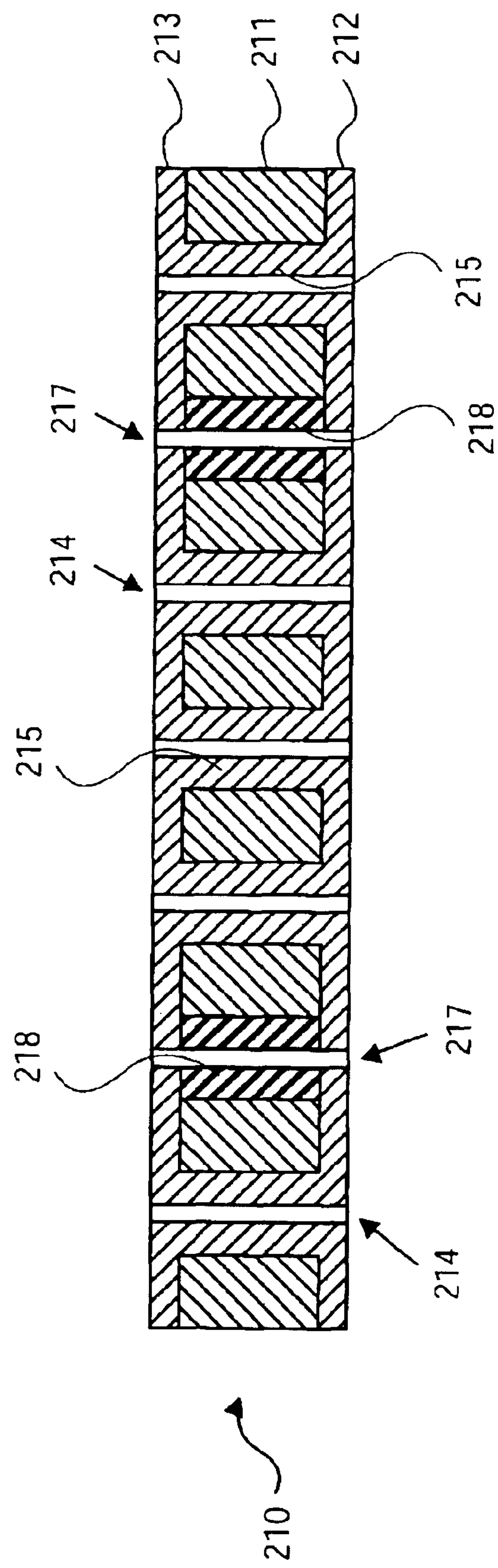
FIG. 2D is a side cross-sectional view of the high capacitance package substrate of FIG. 2C having undergone via repunching.

Referring to FIG. 2D, a side cross-sectional view of the high capacitance package substrate 210 of FIG. 2C is shown. In the embodiment shown, the vias 214, 217 are re-punched to form via-in-via structures as indicated at block 550 of FIG. 5. For example, in one embodiment, re-punching is achieved by machine or laser drilling holes of about one third the diameter of the vias 214, 217. In this manner, interconnect material may be deposited in the holes as described below and at block 560 of FIG. 5 to provide electrical pathways from one side of the core 211 to the other.

Figure 2E:
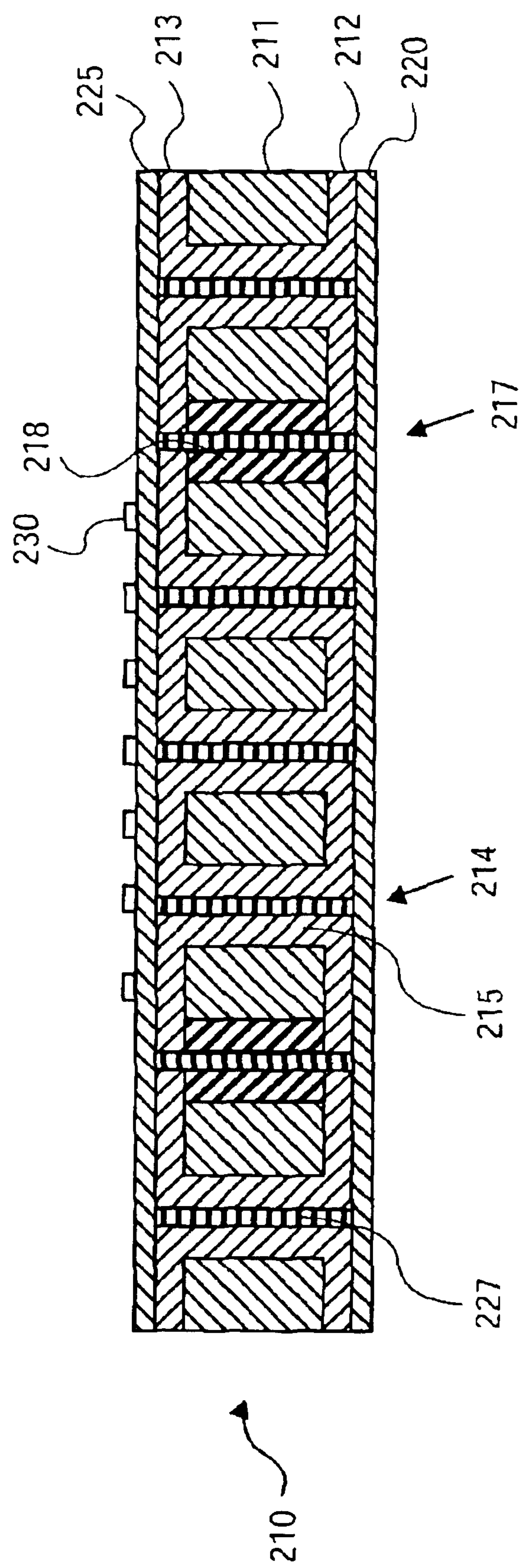
FIG. 2E is a side cross-sectional view of the high capacitance package substrate of FIG. 2D with completed interconnects, circuit layers and bond pads.

Referring to FIG. 2E a side cross-sectional view of the high capacitance package substrate 210 of FIG. 2D is shown following the deposition of interconnect material 227, the formation of circuit layers 220, 225, and the placement of bond pads 230 as also indicated at block 560 of FIG. 5. In one embodiment, a land side circuit layer 220, including circuit features such as patterned signal traces insulated by ILD material, is formed by conventional deposition, patterning and etching techniques. The interconnect material 227 is then deposited to fill the via-in-via holes described above. A die side circuit layer 225, with a particular pattern of circuit features, is deposited in the same manner as the land side circuit layer 225. Each circuit layer 220, 225 may actually include multiple layers of circuitry isolated by ILD material. Bond pads 230 are then placed in electrical connection with the side circuit layer 225.

It is not required that the formation of the circuit layers 220, 225 or placement of the bond pads 230 occur in the order described above. For example, in one embodiment, the die side circuit layer 225 is formed prior to the land side circuit layer 220. Additionally, the particular configuration and make-up of the circuit layers 220, 225 are also a matter of design choice. For example, each of the circuit layers 220, 225 may be of multi-layered and varied circuitry and ILD as noted above.

The interconnect material 227 described above may be of copper or other suitable material for signal transmission. In the embodiment shown, the completed high capacitance package substrate 210 includes vias 214, 217 providing electronic paths across the core 211 by way of the indicated interconnect material 227. That is, the interconnect material 227 of each via 214, 217 is electronically coupled to circuit features of both the land side 220 and the die side 225 circuit layers.

The electronic paths of interconnect material 227 (i.e. the interconnects) may be surrounded by aluminum oxide 218 or other material having a dielectric constant of less than about 4 (i.e. 'low k' material). As indicated above, this allows for high speed signal transmission across the non-ceramic core 210 by way of the high speed vias 217. Alternatively however, high capacitance vias 214 may be provided as indicated above, accommodating additional high capacitance material 215 thereby further increasing the overall capacitance of the high capacitance package substrate 210. Furthermore, the high capacitance vias 214 actually form capacitors as an electronic path passes there through. The determination regarding the placement or ratio of high capacitance vias 214 versus high speed vias 217 is again a matter of design choice.

Figure 3:
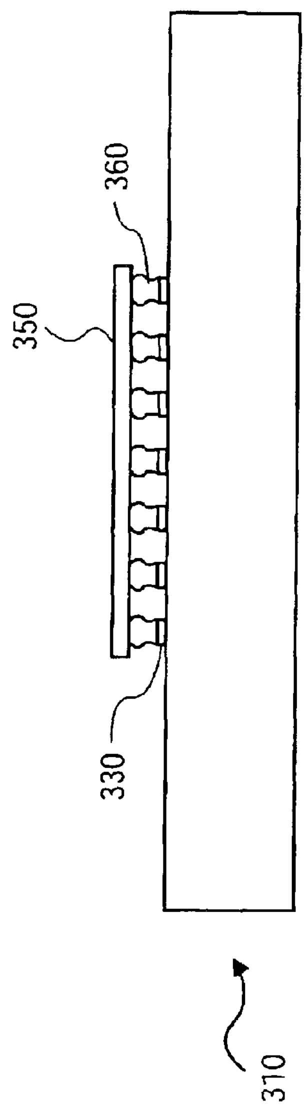
FIG. 3 is a side view of an embodiment of a high capacitance package substrate coupled to a die.
Figure 4:
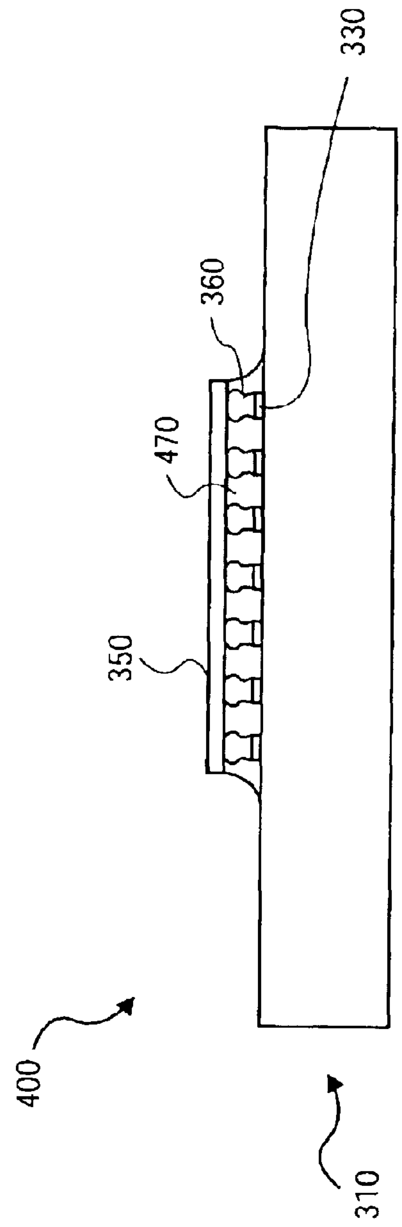
FIG. 4 is a side view of the package substrate of FIG. 3 following reflow and cure of underfill to form a completed semiconductor package.

Referring to FIGS. 3 and 4, an embodiment of a high capacitance package substrate 310 as formed according to embodiments described above with reference to FIGS. 2A–2E is shown. A die 350, including compact internal circuitry in electrical contact with metal bumps 360 is shown. The metal bumps 360 may be of a tin lead solder or other conventional material.

With particular reference to FIG. 3, the die 350 may be delivered to the high capacitance package substrate 310, for example, by a conventional pick and place mechanism. The metal bumps 360 are aligned and soldered to bond pads 330 of the high capacitance package substrate 310.

As shown in FIG. 4, a semiconductor package 400 is completed by delivery and curing of underfill material 470 between the die 350 and the high capacitance package substrate. The underfill material 470 may be a conventional epoxy delivered by a syringe and cured by conventional reflow techniques.

The die 350 shown in FIGS. 3 and 4 may include compact internal circuitry isolated by ILD material. However, in the event of a sudden influx of current beyond what may be isolated to the circuitry of the die 350, the nearby high capacitance package substrate 310 includes added capacitance as described above. Therefore, an overflow of charge or sudden requirement may be accommodated in a manner minimizing cross-talk and signal delays within the circuitry of the die 350.

Referring to FIG. 5, embodiments of forming a high capacitance package substrate are summarized in the form of a flow chart. The high capacitance package substrate is formed according to methods described and detailed above with reference to FIGS. 2A–2E.

Embodiments described above include semiconductor substrates that incorporate added capacitance without the requirement of an expensive ceramic core. Additionally, the time and expense associated with the placement of discrete capacitors and metal insulator metal devices may be reduced by use of embodiments disclosed herein.

Although exemplary embodiments described above reference a particular high capacitance package substrate, additional embodiments are possible. For example, a non-ceramic core may be used to form a high capacitance board substrate (e.g. for the formation of a PCB) according to the embodiments described above. Additionally, a high capacitance die substrate may be formed from a non-ceramic core according to embodiments described above. However, in order to keep with conventional die processing techniques, the high capacitance die substrate would include the deposition of defect free monocrystaline silicon thereon before formation of a completed die. Furthermore, many additional changes, modifications, and substitutions may be made without departing from the spirit and scope of these embodiments.

I claim:

1. A method comprising:

filling at least one of a plurality of vias within a core with a first material comprising a first dielectric constant;

filling at least one of the plurality of vias with a second material comprising a second dielectric constant, wherein the second dielectric constant is greater than the first dielectric constant;

delivering to the core the second material; and sintering the first material and the second material, the core tolerant to said sintering.

2. The method of claim 1 wherein said sintering includes exposing the core to a temperature of up to about 1,427° C.

3. The method of claim 1 wherein said sintering occurs during said delivery.

4. The method of claim 1 wherein the core is non-ceramic.

5. The method of claim 1 further comprising forming the plurality of vias through the core prior to said delivering.

6. The method of claim 5 wherein said delivering comprises:

filling a high capacitance via of the plurality of vias with the second material; and forming a layer of the second material on the core.

7. The method of claim 5 wherein filling at least one of the plurality of vias within the core with the first material comprises filling a high speed via of the plurality of vias with the first material prior to said delivering.

8. The method of claim 7 wherein the first dielectric constant is less than about 4.

9. The method of claim 5 further comprising:

filling each via of the plurality of vias with one of the first material or the second material to display a second dielectric constant greater than the first dielectric constant of the first dielectric material; and forming a hole through each of the first material and the second material of the vias.

10. The method of claim 9 wherein the first dielectric constant is less than about 4.

11. The method of claim 9 further comprising depositing interconnect material in each hole of the vias.

12. The method of claim 11 wherein the interconnect material comprises copper.

13. A method comprising:

delivering a first material having a dielectric constant less than about 4 to at least one of a plurality of vias within a core;

filling at least one of the plurality of vias with a second material comprising a second dielectric constant, wherein the second dielectric constant is greater than the first dielectric constant; and sintering the material on the core, the core tolerant to said sintering.

14. The method of claim 13 wherein said sintering includes exposing the core to a temperature of up to about 1427° C.

* * * * *